United States Patent [19]
Kannegundla et al.

[11] Patent Number: 5,483,155
[45] Date of Patent: Jan. 9, 1996

[54] TEST SYSTEM AND METHOD FOR DYNAMIC TESTING OF A PLURALITY OF PACKAGED SAME-TYPE CHARGE COUPLED DEVICE IMAGE SENSORS

[75] Inventors: Ram Kannegundla, Rochester; Russell J. Taras, W. Henrietta, both of N.Y.

[73] Assignee: Eastman Kodak Company, Rochester, N.Y.

[21] Appl. No.: 306,348

[22] Filed: Sep. 15, 1994

Related U.S. Application Data

[63] Continuation-in-part of Ser. No. 979,713, Nov. 20, 1992, abandoned.

[51] Int. Cl.$^6$ .................................................. G01R 31/28
[52] U.S. Cl. ................ 324/158.1; 324/73.1; 324/500; 324/765; 340/653
[58] Field of Search ............................ 324/73.1, 765, 324/653, 500, 538, 537

[56] References Cited

U.S. PATENT DOCUMENTS 5,113,134   5/1992   Plus et al. .......................... 324/158 R Primary Examiner—Kenneth A. Wieder
Assistant Examiner—Barry C. Bowser
Attorney, Agent, or Firm—James D. Leimbach

[57] ABSTRACT

A test system is provided for the dynamic testing at the same time of a plurality of packaged charge coupled device (CCD) image sensors in which the plurality of image sensors of the same sensor type can be tested under conditions including selectable signal levels of bias control signals and selected signal levels and pulse durations of clocked control signals appropriate to the type of CCD image sensor of the plurality of sensors under test. The test system provides selectably level-adjusted control signals, selector switch means for generating selectable clock signals having the level-adjusted signal levels, and a clock driver for amplifying the clocked control signals. The amplified control signals are directed to a common input terminal of an isolation network assembly, each of separate output terminals thereof connected to a corresponding input terminal of each one of the CCD image sensors to be tested. The test system is designed such that a sole remaining functioning CCD image sensor of the plurality of sensors can still be dynamically tested while all others of the plurality of CCD image sensors have experienced a catastrophic short-circuit condition at the corresponding clocked-signal input terminal.

7 Claims, 7 Drawing Sheets

TEST SYSTEM AND METHOD FOR DYNAMIC TESTING OF A PLURALITY OF PACKAGED SAME-TYPE CHARGE COUPLED DEVICE IMAGE SENSORS

CROSS REFERENCE TO RELATED APPLICATIONS

This is a continuation-in-part of application Ser. No. 07/979,713, filed Nov. 20, 1992, now abandoned entitled "Circuitry for Automated Testing of a Plurality of Semiconductor Devices (amended)" to Ram Kannegundla and Russell J. Taras.

FIELD OF THE INVENTION

The present invention relates generally to testing of charge coupled device (CCD) image sensors and more particularly to a test system and method for dynamic testing at the same time of a plurality of packaged CCD image sensors of one and the same type under conditions which include selectable bias signal levels and selectable clocked signal levels applied to dedicated input terminals of each one of the plurality of packaged sensors, the test system configured in a manner such that a catastrophic short-circuit failure of all but one of the plurality being tested will ensure continuing dynamic testing of the sole remaining functional CCD image sensor under acceptable conditions of imaging performance.

BACKGROUND OF THE INVENTION

Recent years have seen the rapid development of various classes and types of CCD image sensors and their present widespread use in imaging systems for both amateur and professional applications. Their small size, electrical efficiency, cost-effectiveness, etc., have made CCD image sensors the imaging units of choice, not only for inexpensive consumer video cameras, but for more critical uses in professional or commercial applications such as, for example, in digital color printer applications and high-speed scanning applications.

Due to the nature of the manufacturing processes used to produce these relatively complex multi-level thin film structures, there is a constant effort directed to improve these multi-step fabrication efforts and device yields, by incorporating knowledge gained from testing completed and packaged CCD image sensors under various conditions such as, for example, conditions of elevated temperature, high illumination levels, and under conditions where higher levels of control signals are applied than required during normal operating conditions.

Currently employed test systems, while partially automated, rely largely on a number of individual control signal generators, each one of which is dedicated to providing the control signals required for the operation of a single CCD image sensor. This approach of using one dedicated control signal supply for each one CCD image sensor to be tested may be adequate in situations where testing is done on relatively few devices or relatively infrequently. The complexity, space requirements, and cost of using dedicated control signal supplies for testing CCD image sensors can be appreciated by considering a numerical example: if a manufacturer of CCD image sensors produces even as few as 20 packaged devices in a certain time period, these 20 devices would either have to be tested sequentially using one and the same dedicated control signal generator, or 20 control signal generators could be constructed or purchased at significant cost and space allocation considerations to then test each of the 20 sensors at about the same time side by side. If, for example, 20 packaged image sensors of each one of five types or classes are to be tested over a time period one faces the unenviable prospect of considering the design, construction or purchase of a total of 100 dedicated control signal generators, only 20 of which can be used to control respective ones of the sensors.

Thus, while it is clearly possible to use a dedicated control signal supply or a dedicated control signal generator to functionally test a single CCD image sensor (which may be a so-called mega-pixel imager having at least a million photodiode-like light sensitive pixels and an equally large number of shift register storage and charge transport regions of a semiconductor nature), it is nonetheless economically unattractive in view of the above examples. Another known test system dedicated to testing in a semi-automated manner a single device at a time is disclosed in U.S. Pat. No. 5,113,134, issued May 12, 1992 to Plus et al, in which a test circuit is used to test but a single liquid crystal display at a time, the display having numerous nominally identical thin film transistor elements within it as part of its design. Thus, the disclosure by Plus only applies to the sequential testing of individual liquid crystal display devices of one and the same type. The teaching provided in the disclosure of U.S. Pat. No. 5,113,134 does not appear to include selectability of the integrated test circuit so as to either make it adaptable to functionally test a plurality of same-type liquid crystal displays at the same time, or alternatively to adapt the integrated test circuit to be effectively usable to test different types of liquid crystal displays one display at a time.

Accordingly, it is highly desirable to provide a test system and method for dynamic testing at the same time of a plurality of packaged CCD image sensors.

It is desirable to provide a versatile test system which can be readily changed and adapted to test a plurality of a different class or type of CCD image sensors.

And it is desirable to provide a test system having the number of interconnections between a control signal generating portion of the system and another portion of the system (which accommodates the plurality of CCD image sensors to be tested) be no larger than the number of connections required by an individual CCD image sensor.

SUMMARY OF THE INVENTION

Viewed from one aspect, the present invention provides a test system for dynamic testing at the same time of a plurality of packaged CCD image sensors of the same type, the test system selectably providing DC bias control signals and clocked control signals to each one of the plurality of the same-type CCD image sensors to be tested, and it particularly provides the clocked control signals required by each CCD image sensor through an isolation network disposed between a signal generating portion of the test system and each one of the plurality of CCD image sensors.

Viewed from another aspect, the present invention provides for a versatile control signal generating portion of the test system which can be readily and selectably adjusted to accommodate the dynamic testing of a plurality of packaged CCD image sensors comprising a different class or type of sensor.

Viewed from a further aspect, the present invention provides a method of dynamic testing at the same time of a plurality of packaged charge coupled device image sensors of one and the same type of sensor.

The present invention will be better understood and more fully appreciated from a consideration of the following detailed description given in conjunction with the accompanying drawings and claims.

DETAILED DESCRIPTION

Figure 1:
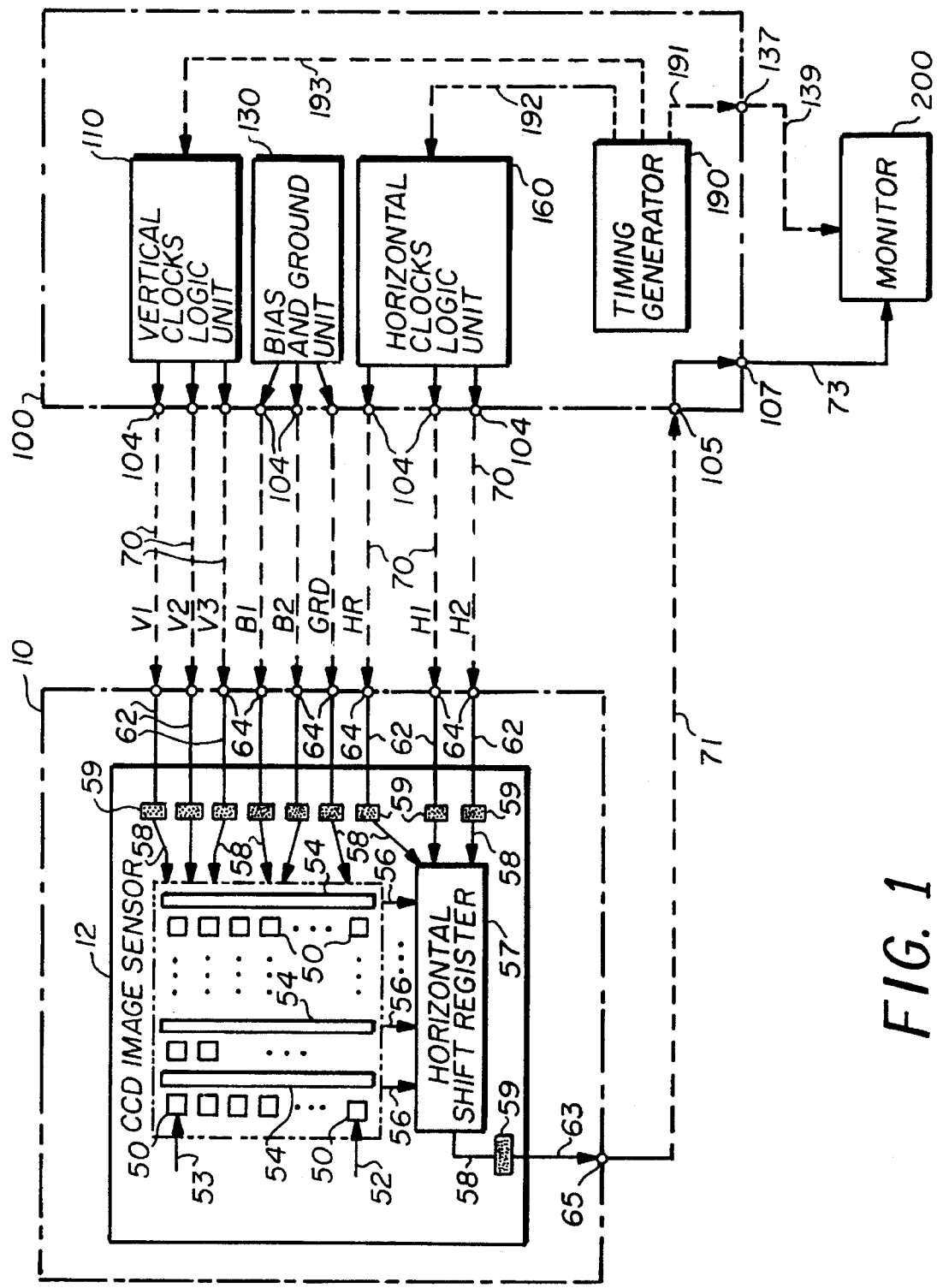
FIG. 1 shows schematically a packaged charge coupled device (CCD) image sensor receiving control signals from a dedicated control signal supply via a multi-conductor cable.

Referring now to FIG. 1, there is shown schematically a CCD image sensor 12 disposed in a package 10 (hereinafter referred to as a packaged CCD image sensor 10). The package 10 has control signal input terminals indicated at 64 and a signal output terminal 65. A control signal supply 100 is dedicated to providing all the control signals required by the sensor 12 via output terminals indicated at 104 and via multiple traces on the same board or a connector if the sensors are on a separate board indicated at 70 to the input terminals 64 of the packaged image sensor.

Briefly described, the control signal supply 100 has a timing generator 190 which provides timing signals via multi-conductors 192 and 193, respectively to a horizontal clocks logic unit 160 and a vertical clocks logic unit 110, respectively. The timing generator 190 is shown as providing synchronization and control signals via a multi-conductor cable 191 to an output terminal 137 and from there via a multi-conductor cable 139 to an input of a monitor 200. A bias and ground unit 130 provides various DC bias potentials, for example, indicated as B1 and B2, as well as a ground reference GRD. The vertical clocks logic unit 110 provides to the CCD image sensor clocked vertical control signals V1, V2, and V3, and the horizontal clocks logic unit 160 provides clocked horizontal control signals H1, H2, and a horizontal reset signal HR.

The control signal input terminals 64 of the CCD image sensor package 10 can be terminals disposed around the periphery of the package 10 or they may be pin-type terminals actually disposed beneath the package 10. Connections indicated at 62 and 63, respectively, between the input terminals 64 and so-called bond pads 59 disposed around the periphery of the CCD image sensor 12 may be in the form of so-called bond wires. Extending inwardly from the bond pads 59 are arrows indicated at 58 which denote electrical connections internal to the CCD image sensor 12.

Both the packaged image sensor 10 and the control signal supply 100 dedicated to providing appropriate control signals for the operation of the CCD image sensor 12 are well known in the art. Their interaction will be briefly described here so as to indicate the relatively high level of complexity involved in controlling a single CCD image sensor 12 such that the sensor can be operative in an acceptable dynamic manner.

The image sensor 12 has light-sensitive picture cells 50, simply called pixels, arranged in horizontal rows or lines as indicated by arrows 52 and 53 for a first row and a last row of pixels 50, respectively, and in orthogonal columns as indicated by vertical shift registers 54 (3 of which are shown). A horizontal shift register 57 is receiving signal charges representing a row of pixels at a time from each of the vertical shift registers 54, as indicated by downwardly pointing arrows 56.

The image sensor 12 shown here is an illustrative example of a so-called interline-transfer CCD image sensor, since each vertical shift register 54 is disposed laterally adjacent to an associated column of pixels 50. The vertical shifting of pixel image signals occurs along the vertical shift registers 54 under the control of clocked vertical control signals V1 and V2. Prior to such vertical shifting of pixel image signals, a vertical control signal V3 provides a single so-called frame shift pulse which induces the simultaneous shifting in a horizontal direction of pixel image signals of all of the pixels in each vertical column from these pixels 50 into the respectively associated vertical shift register 54. The vertical shifting of pixel image signals in the vertical shift registers 54 now proceeds pixel line by pixel line, with a first pixel line 52 being shifted into the horizontal shift register 57 and being horizontally clocked out therefrom pixel by pixel under the control of the clocked horizontal control signals Hi and H2. The output from the horizontal shift register 57 at a signal output terminal 65 is directed via a lead 71 to an input terminal 105 of the control signal supply 100, wherein the signal may be processed to become available at an output terminal 107 via a lead 73 as a video signal input to a monitor 200.

This vertical line-by-line shifting and the horizontal clocking of each line of pixel image signals commences in a temporally controlled and synchronized manner pixel line by pixel line until the last line 53 of pixel image signals has been read out. If displayed on the monitor 200 line-by-line (row-by-row), the total number of pixel rows included from row 52 through row 53 would constitute a single image frame. Then the procedure continues for a subsequent image frame, thereby providing on monitor 200 a continuous display of successive image frames, as is well known in video cameras using a charge coupled device image sensor and a control signal supply dedicated to its operation.

The CCD image sensor 12 is shown to have input terminals for each one of eight control signals and one terminal for a ground reference input. A CCD image sensor may require more than the two DC bias input signals B1 and B2 shown here.

A different type of image sensor, for example, a so-called frame-transfer CCD image sensor, usually does not require the clocked vertical frame shift control signal V3, and the clocked vertical control signals V1 and V2, as well as the DC bias signals and the clocked horizontal control signals H1 and H2 may require different signal levels and different frequencies and temporal relationships among the clocked signals. In fact, different designs among the same type of CCD image sensor (such as an interline-transfer type or a frame-transfer type) usually require different control signals, different control signal levels, and different frequencies and temporal relationships of the clocked signals.

Thus, it is evident from FIG. 1 that the particular CCD image sensor 12 requires for optimal performance particular control signals which are provided by a control signal supply dedicated to control this one image sensor.

Figure 2:
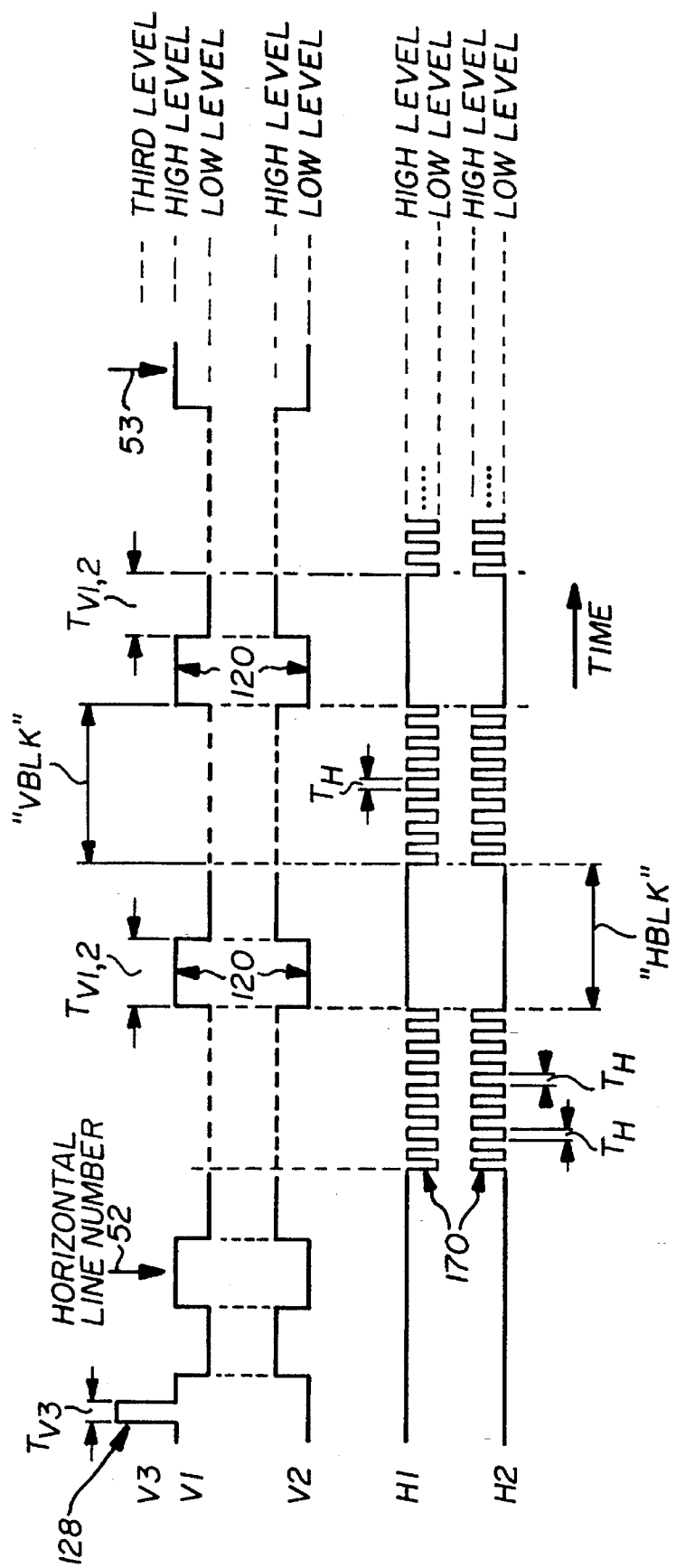
FIG. 2 depicts schematically some clocked vertical and horizontal control signals provided by the control signal supply of FIG. 1 and required to operate the CCD image sensor in a dynamic mode.

Referring now to FIG. 2, there are depicted schematically some of the clocked vertical and horizontal control signals provided by the control signal supply of FIG. 1, as required to operate the CCD image sensor 12 in an acceptable, dynamic mode. Time is shown along a horizontal axis and high and low signal levels, as well as a third signal level, are indicated along a vertical axis. With the exception of a V3 third level pulse 128, the vertical control signals V1 and V2 are complementary, providing vertical shift pulses 120 having a duration $T_{V1, 2}$, and having so-called vertical blank intervals "VBLK". During each one of the V1 and V2 pulses 120, the V1 signal goes from a low level to a high level while the complementary V2 signal goes from a high level to a low level. During each of the pulses 120, the pixel image signals stored in the vertical shift registers 54 of FIG. 1 are advanced toward the horizontal shift register 57 by one pixel line or pixel row starting with the first horizontal pixel line number 52 being shifted into the horizontal shift register 57. This vertical shifting of pixel image signals continues until the last row or line of pixel image signals corresponding to the pixel line 53 has been shifted vertically downwardly into the horizontal shift register. The V3 control signal pulse 128 shown as having a third level and a duration $T_{V3}$, precedes a first one of the V1 and V2 vertical shift register pulses 120. Pulse 128 is a frame shift pulse which simultaneously shifts (in a horizontal direction) the pixel image signals from each column of pixels 50 into its associated vertical shift register 54. Thus, the V3 pulse 128 occurs only once per image frame.

Shown below the clocked vertical control signals are the clocked horizontal control signals H1 and H2 which are complementary to each other. The horizontal control signals have pulses 170 of a pulse duration $T_H$. As indicated, the horizontal clock pulses 170 have a significantly higher frequency or pulse repetition rate than the pulses 120 of the vertical clocks. The onset of the horizontal clocks occurs at a time shortly after the end of each one of the V1 and V2 pulses 120 and within the VBLK intervals. Stated differently, the image pixel signals are clocked out of the horizontal shift register 57 during the vertical blank interval "VBLK." The H1 and H2 control signals have a horizontal blank interval "HBLK" which begins at the onset of each of the V1 and V2 pulses 120 and ends shortly after these pulses have terminated. The vertical control signal pulses 120, as well as the horizontal control signal pulses 170, are shown as having a 50% duty cycle.

It should be noted that the respective high and low levels of the vertical control signals V1 and V2 may have different values than the high and low levels of the horizontal control signals H1 and H2. Thus, as indicated previously, the control signal supply 100 of FIG. 1 is dedicated to providing to the CCD image sensor 12 (in package 10) those particular clocked signals and DC bias levels required by that particular image sensor in order to function optimally.

Figure 3:
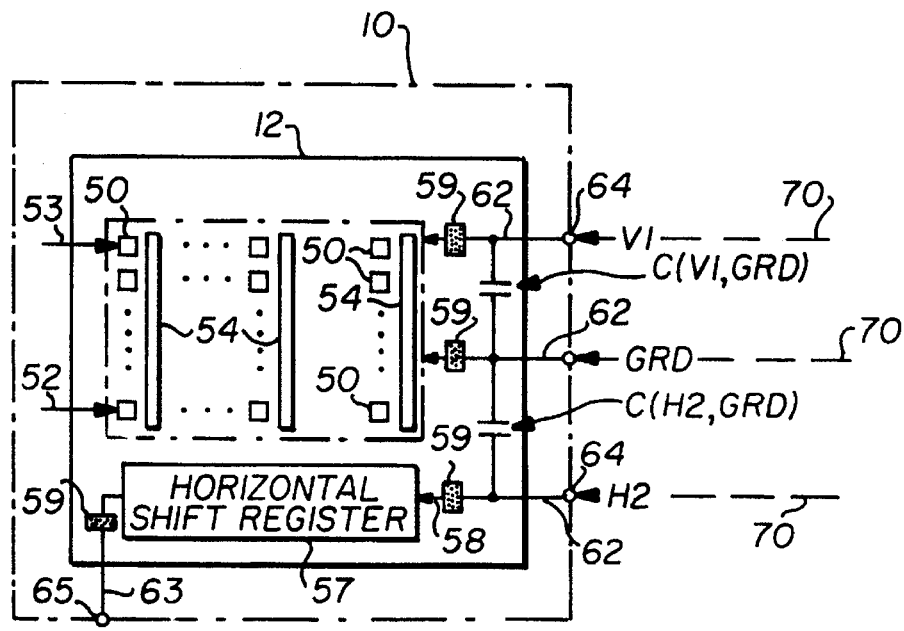
FIG. 3 shows schematically an effective input capacitance of the CCD image sensor of FIG. 1 between a vertical control signal input terminal and a ground terminal, and between a horizontal control signal input terminal and a ground terminal.

Referring now to FIG. 3, there is shown schematically an effective input capacitance C (V1, GRD) between a V1 input terminal and a ground terminal. Also shown is another input capacitance C (H2, GRD) between an H2 input terminal to the packaged image sensor and a ground terminal GRD.

In general, an effective input capacitance between a V1 terminal and a ground terminal is significantly larger in magnitude than an effective input capacitance between a horizontal control input terminal and ground, since the effective vertical shift register input capacitance is reflective of the sum of all capacitance values distributed throughout the vertical shift registers 54, whereas the effective input capacitance of a horizontal shift register is lower since a horizontal shift register is essentially a single pixel register. However, the vertical control signals V1 and V2, as shown in FIG. 2, have a lower pulse frequency, while the pulse frequency of the H1 and H2 clock signals is significantly higher. For example, in a so-called mega-pixel CCD image sensor (having at least 1,000 pixels 50 in each row of pixels and at least 1,000 rows of pixels) the effective vertical input capacitance C (V1, GRD; V2, GRD) can be higher than 10,000 pF, while the effective input capacitance of a horizontal shift register C (Hi, GRD; H2, GRD) may be as low as 100 pF. The duration $T_{V1, 2}$ of a V1 or a V2 pulse 120 can be several microseconds, whereas the duration TH of a H1 and H2 clock pulse 170 may be in the range of 100 nanoseconds for a particular CCD image sensor.

Figure 4A:
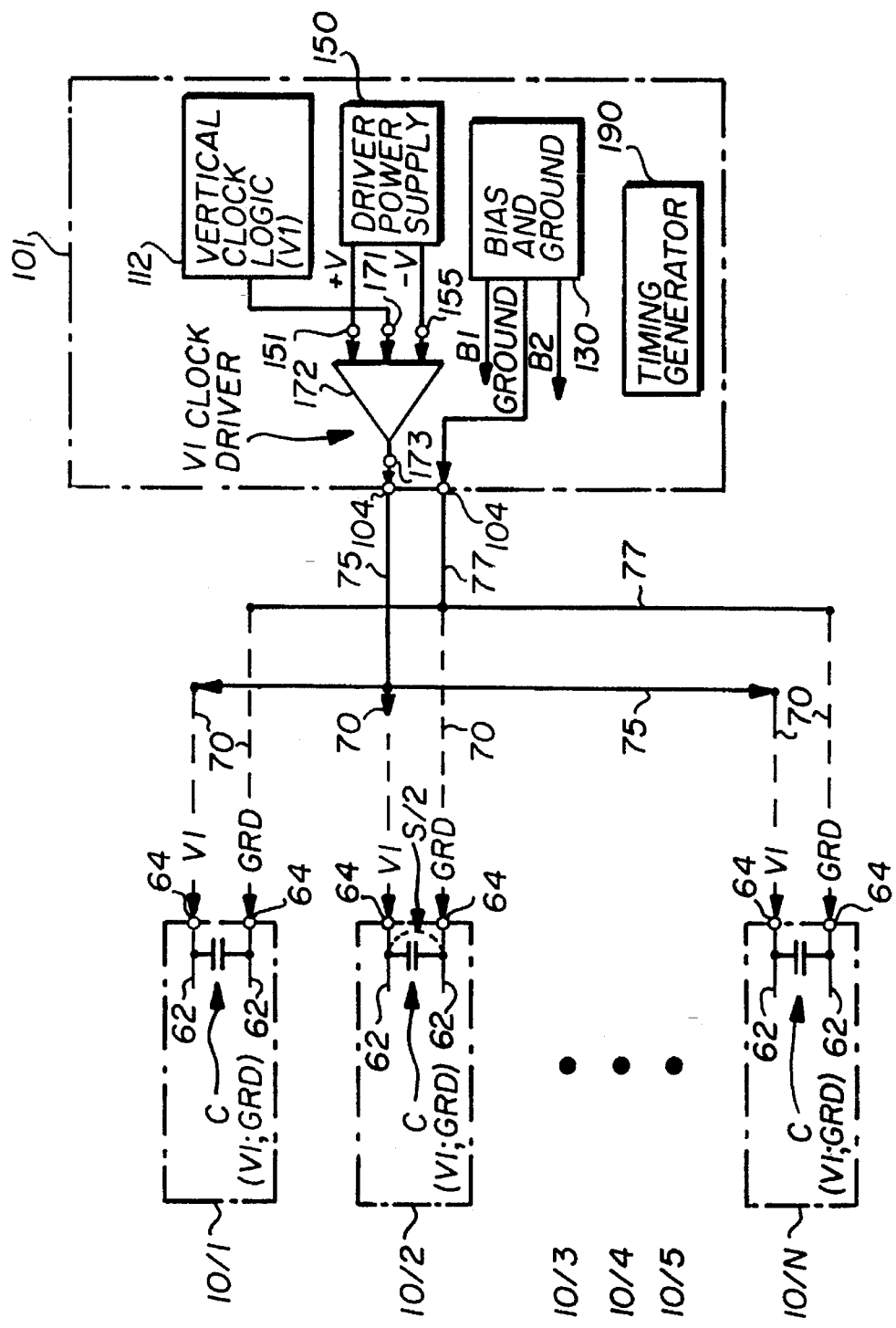
FIG. 4A is a schematic block diagram of a prior art control signal supply shown as having a single clock driver which provides a vertical control signal to the input of each one of a plurality of N CCD image sensors, with one image sensor depicted as having a short-circuit input failure.

Referring now to FIG. 4A, there is shown a control signal supply 101 which provides (for illustrative purposes only) a V1 vertical control signal to the respective V1 input terminals of each one of a plurality of packaged CCD image sensors 10/1–10/N. Each one of the image sensors is depicted as having an effective input capacitance C (V1, GRD) between the respective V1 and ground (GRD) input terminals. The image sensor 10/2 is shown as having a short-circuit failure S/2 at its input as indicated by a curved dotted line.

The control signal supply 101 includes, in addition to the previously discussed timing generator 190, the bias supply unit 130, and a vertical clock logic unit 112, also a V1 clock driver 172 to provide a V1 clock output signal at a terminal 173 thereof so as to enable the V1 clock driving of the plurality of image sensors 10/1–10/N. Power is provided to the V1 clock driver 172 from a driver power supply 150 at input terminals 151 and 155, and an output of a vertical clock logic unit 112 is applied to an input 171 of the clock driver 172.

As may be readily appreciated, the output signal of the V1 clock driver 172 at its output terminal 173 and, therefore, at the output terminal 104 of the control signal supply 101, will approach a significantly reduced signal level when any one of the plurality of CCD image sensors 10/1–10/N experiences a short-circuit failure internal to the sensors, as indicated for the image sensor 10/2.

Accordingly, this particular prior art control signal supply 101 can effectively supply the V1 control signals at the required high and low levels so long as none of the image sensors 10/1–10/N develops a catastrophic short-circuit failure at its input during functional or dynamic testing of the plurality of image sensors.

Figure 4B:
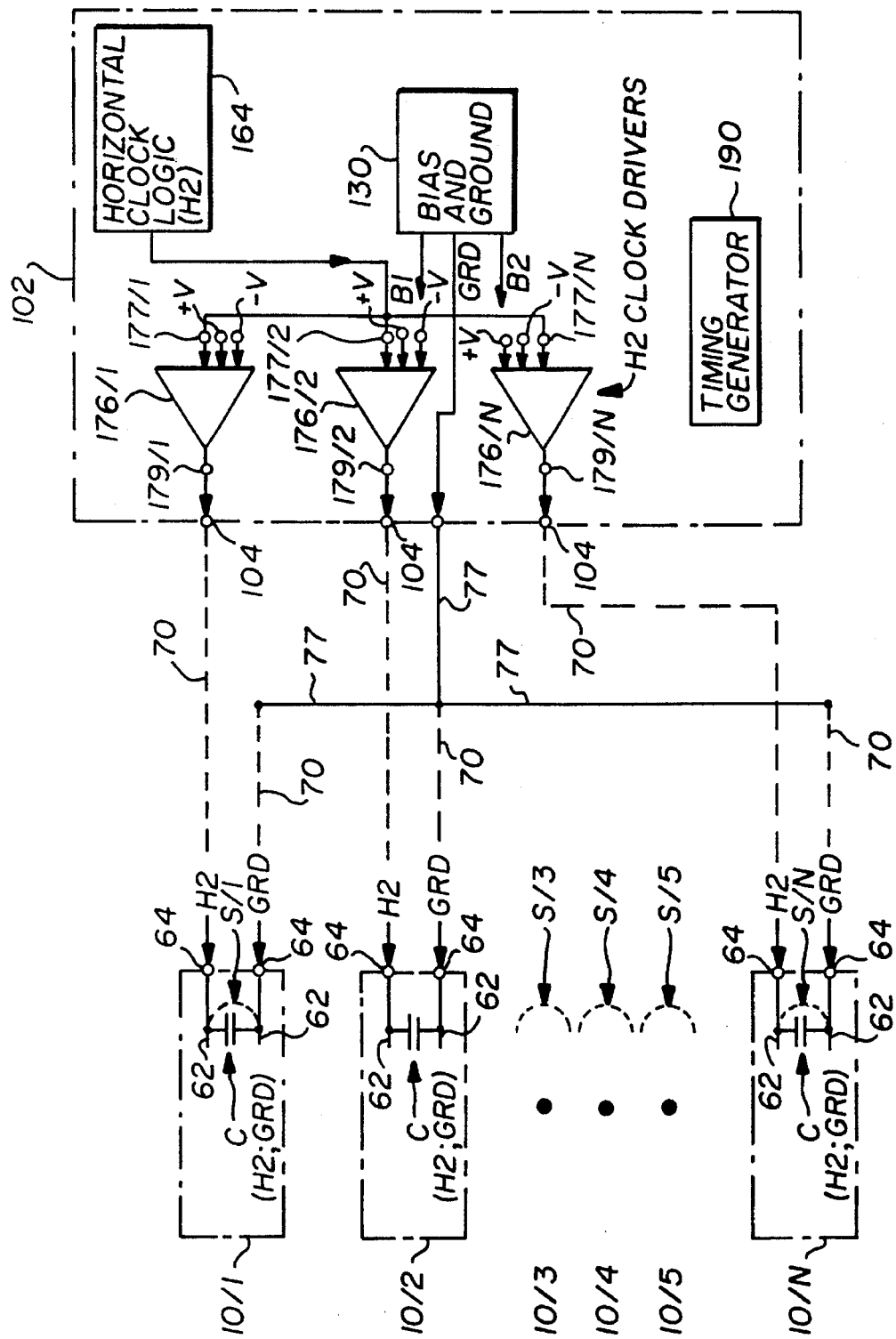
FIG. 4B is a schematic block diagram of another prior art control signal supply shown as having a plurality of N clock drivers, each one of the clock drivers providing a horizontal control signal to the input of a corresponding one of a plurality of N CCD image sensors, with several image sensors depicted as having a short-circuit input failure.

Referring now to FIG. 4B, there is shown a schematic block diagram of another prior art control signal supply 102, shown (for illustrative purposes) as having a plurality of N horizontal clock drivers 176/1–176/N, each one of the clock drivers 176 providing a horizontal control signal H2 to the input of a corresponding one of a plurality of N CCD image sensors 10/1–10/N. All image sensors except for sensor 10/2 are depicted as having a short-circuit failure S/1, S/3–S/N internal to the devices and evidenced at the respective input terminal 64.

It will be appreciated that the control signal supply 102 will continue to provide an H2 horizontal clock signal via the H2 clock driver 176/2 to the CCD image sensor 10/2, while all other clock drivers 176 will exhibit a significantly reduced or even a zero level output signal due to the short-circuit condition at the inputs of each one of the other image sensors. However, this feature of the prior art control signal supply 102 is provided at a significantly increased complexity and expense due to the requirement of N clock drivers and N clock lines for H2 to be connected to N sensors.

Figure 5:
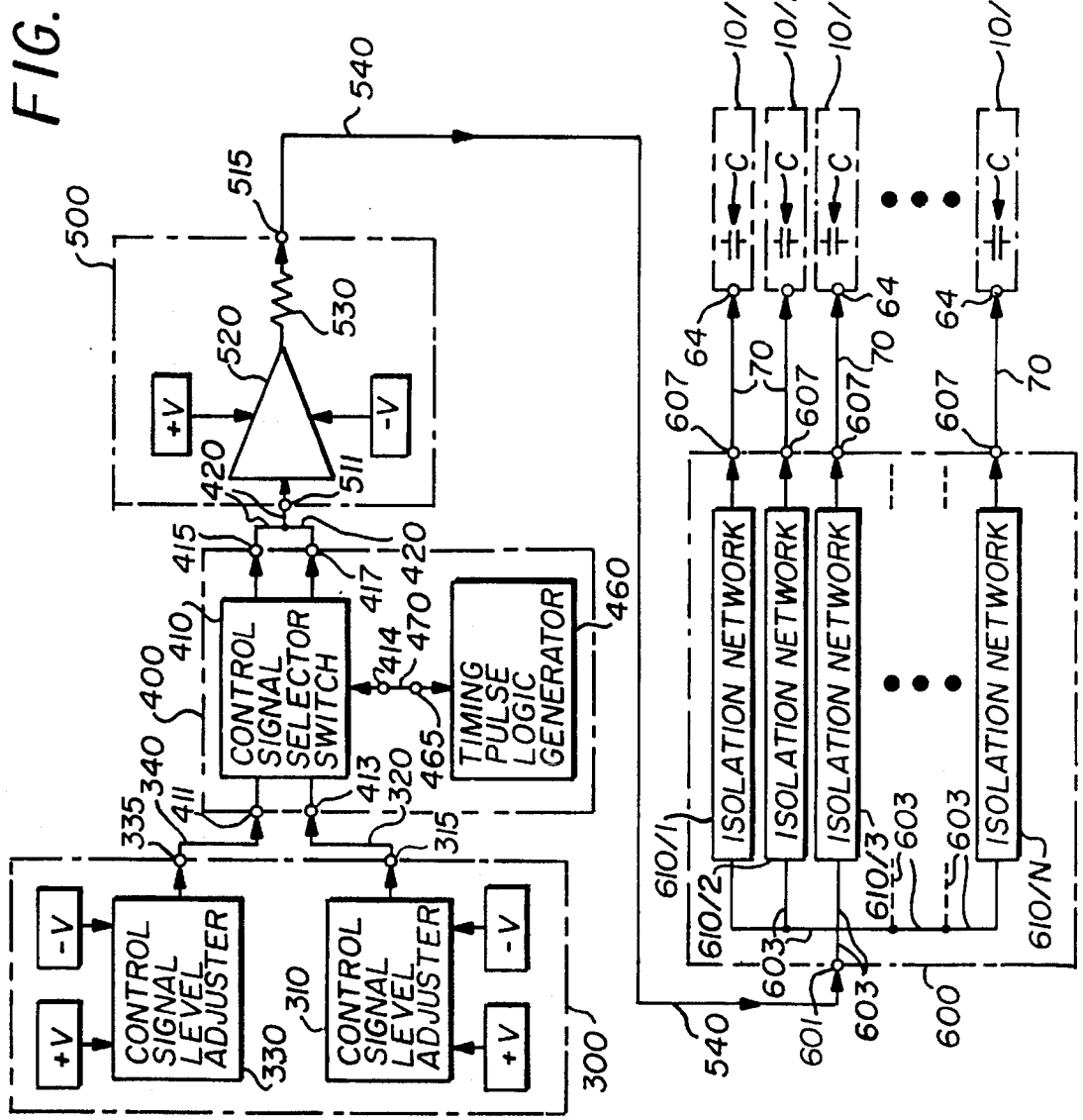
FIG. 5 is a schematic block diagram of a test system in accordance with the invention for dynamic testing of a plurality of CCD image sensors, shown as providing a control signal level adjustor assembly, a control signal selector assembly including a timing pulse logic generator, a single clock driver having a defined source resistance, an isolation network assembly comprising N isolation networks having a common input terminal connected to a clock driver output terminal and having a separate output terminal of each isolation network connected to a corresponding separate input terminal of each one of a plurality of N CCD image sensors.

Referring now to FIG. 5, there is shown a schematic block diagram of a test system in accordance with the invention for dynamic testing of a plurality of CCD image sensors. The system includes a control signal level adjustor assembly, generally indicated at 300, and shown as having two control signal level adjustors 310 and 330. Each one of the control signal level adjustors 310, 330 provides at respective output terminals 315 and 335 thereof a selectable and independently adjustable control signal level, the adjustment being derived from voltage supply inputs designated as +V and –V, respectively. The selected control signal levels are applied to respective input terminals 411 and 413 of a control signal selector assembly 400 via respective leads 340 and 320.

The control signal selector assembly 400 includes a control signal selector switch 410 having input terminals 411 and 413 and output terminals 415 and 417, as well as a control terminal 414. An output terminal 465 of a timing pulse logic generator 460 is connected via a lead 470 to the control terminal 414 of the selector switch 410. The selector switch 410 is responsive to logic-level signals applied to the control terminal 414. For example, if a logic level "1" (signal present) pulse signal is provided by the timing pulse logic generator 460 to the control terminal 414, the selector switch 410 responds by connecting its input terminal 411 to its output terminal 415. When a logic level "0" (signal absent) prevails at the control terminal 414, the selector switch 410 responds by connecting its input terminal 413 to its output terminal 417 while at the same time disconnecting the input terminal 411 from the output terminal 415. The output terminals 415 and 417 of the control signal selector 400 are shown as connected to a common lead 420 which provides an output signal from the control signal selector switch 410 to an input terminal 511 of a clock driver indicated at 500.

The clock driver 500 includes a clock driver amplifier 520 having a defined (internal) output source resistance 530 as viewed from an output terminal 515 thereof. The clock driver amplifier 520 can provide output signals at terminal 525 which can range in signal level between a +V value and a –V value, as indicated by the respective power supply inputs to the amplifier 520. A lead 540 connects the output terminal 515 of the clock driver 500 to an input terminal 601 of an isolation network assembly 600.

The input terminal 601 of the isolation network assembly 600 is connected via common leads 603 to the inputs of each one of a plurality of isolation networks 610/1, 610/2, 610/3, through 610/N. Each one of the isolation networks has a separate output terminal indicated at 607, each separate output terminal being connected via a lead 70 to an input 64 of each one of a plurality of CCD image sensors 10/1, 10/2, 10/3, through 10/N. An input capacitance C is indicated schematically for each of the CCD image sensors, as was described previously in conjunction with FIGS. 3, 4A, and 4B.

It will be appreciated that for clarity of presentation, FIG. 5 indicates only one single input to each one of the plurality of N image sensors. To facilitate dynamic testing of the plurality of N image sensors at the same time a complete testing system includes a system such as depicted in FIG. 5 for each one of the clock signal inputs V1, V2, V3, and H1, H2, and HR as shown in FIG. 1.

The test system shown in FIG. 5 provides numerous and significant advantages over the prior art testing systems such as indicated in conjunction with FIGS. 4A and 4B. One significant difference between the prior art systems and the system of FIG. 5 is that the instant test system is no longer a system dedicated to testing a plurality of image sensors of only one particular class or type of image sensors. While each one of the plurality of image sensors to be dynamically tested is, of course, of one and the same class and of the same type of sensor, the present testing system can readily be changed to facilitate the dynamic testing of a plurality of nominally identical image sensors of a different class or type of sensor by selectably adjusting the respective control level signals in the control signal level adjustor assembly 300, by selectably providing the appropriate timing pulse frequencies (via selection in the timing pulse logic generator 460) which selectably actuate the control signal selector switch 410, and by selecting a different isolation network assembly 600 comprising the plurality of identical isolation networks 610/1 through 610/N. Furthermore, the isolation networks are configured such that, in consideration of the output source resistance 530 of the clock driver amplifier 520, the clocked control signals applied to an input of each separate one of the plurality of N CCD image sensors will be maintained within specified limits or tolerances even if N-1 of the plurality of N image sensors should experience a catastrophic short-circuit input failure during the progress of the dynamic testing of the sensors.

Figure 6:
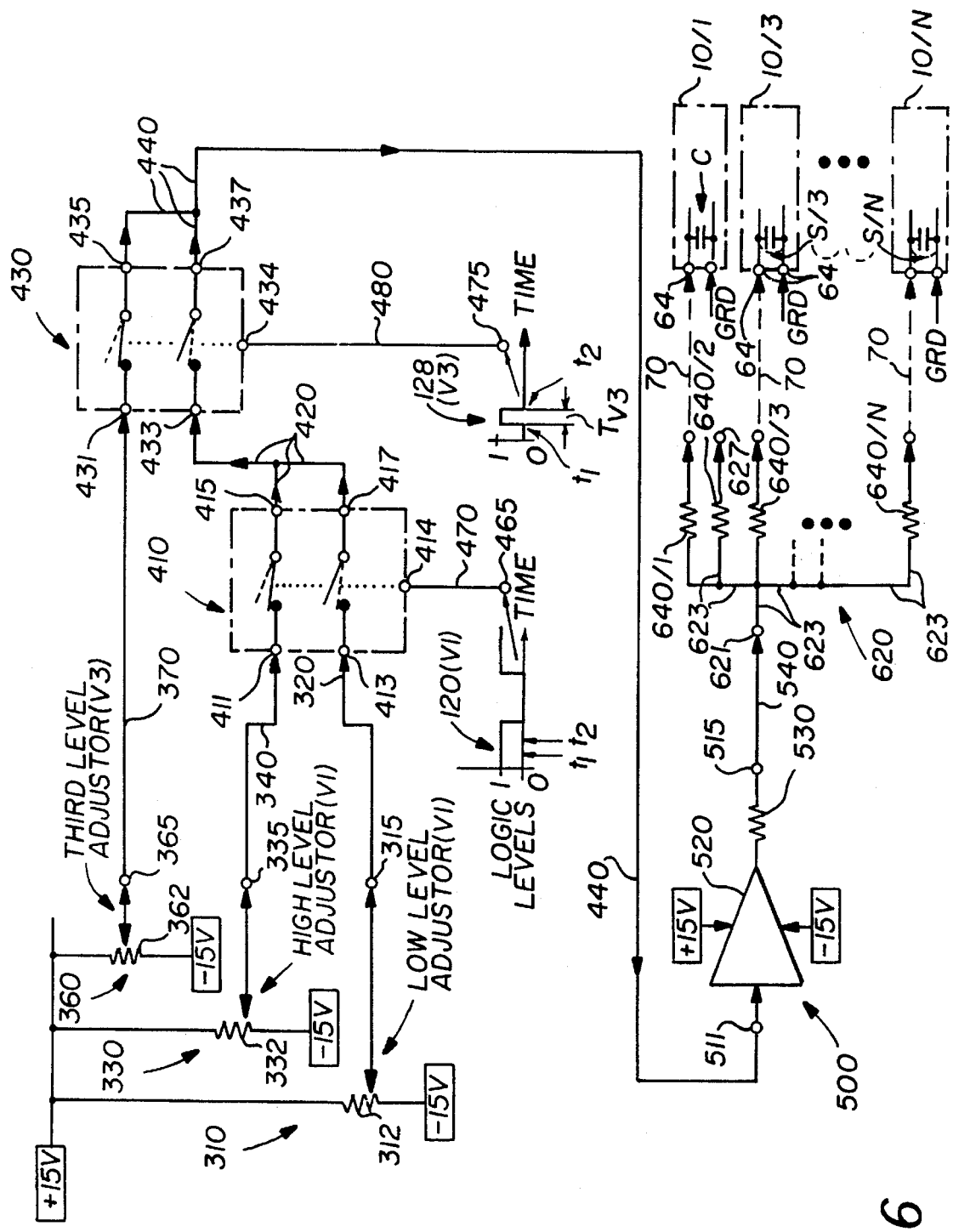
FIG. 6 depicts schematically the test system of FIG. 5 showing in greater detail a preferred embodiment having three level adjustors and two control signal selectors actuated by timing pulses, and a purely resistive isolation network assembly providing control signals to an input of each one of a plurality of N CCD image sensors.

Referring now to FIG. 6, there is shown schematically the test system of FIG. 5 in more detail and as a currently preferred embodiment. This system differs from the system of FIG. 5 in that it includes three control signal level adjustors, two control signal selector switches, and a purely resistive isolation network assembly having a plurality of N resistive isolation networks.

In the test system of FIG. 6, a control signal level adjustor 310 provides for the adjustment of a "low" signal level, shown as an example only, for the clocked vertical control signal V1. The low level signal adjustment is provided by a potentiometer 312 connected between voltage supplies of +15 volt and −15 volt, respectively. A control signal level adjustor 330 having a potentiometer 332 similarly disposed between the +15 volt and −15 volt supplies provides for a "high" level adjustment of the exemplary V1 control signal. Finally, a third control signal level adjustor 360 provides via a potentiometer 362 for the adjustment of a "third" signal level and indicated as associated with the vertical control signal V3 shown in FIG. 2 as a frame shift pulse 128. An output terminal 315 of the control signal level adjustor 310 is connected via a lead 320 to a first input terminal 413 of a selector switch 410. An output terminal 335 of the control signal level adjustor 330 is connected via a lead 340 to a second input terminal 411 of the selector switch 410. And a terminal 365 of the control signal level adjustor 360 provides the third level signal via a lead 370 to a first input terminal 431 of a second control signal selector switch 430.

The first control signal selector switch 410 is shown as having an output terminal 415 and an output terminal 417 connected by a common lead 420, which is connected to a second input terminal 433 of the second selector switch 430. The second selector switch 430 is shown as having an output terminal 435 and an output terminal 437 connected to a common lead 440, which provides an output signal of the second selector switch 430 to an input terminal 511 of a clock driver 500.

First selector switch 410 has a control terminal 414 and the second selector switch 430 has a control terminal 434. Control terminal 414 is shown connected via a lead 470 to a terminal 465, which is the output terminal of the timing pulse logic generator 460 shown in FIG. 5, and the control input terminal 434 of the second selector switch 430 is shown as connected via a lead 480 to a terminal 475 which is an output terminal of another timing pulse logic generator (not shown) providing different logic signal pulses.

In place of showing a timing pulse logic generator 460 (as in FIG. 5), timing pulses supplied by such timing pulse generator are shown here by way of example as provided at the respective terminals 465 and 475. A V1 pulse 120 (FIG. 2), having logic levels 1 and 0, is depicted at the terminal 465 and is, therefore, applied to the control terminal 414 of the first selector switch 410. Inputted to the terminal 475 is shown a pulse 128 (V3), also shown in FIG. 2.

Although depicted as double-pole double-throw mechanical switches, the control signal selector switches 410 and 430 are actually solid-state analog multiplexer switches well known in the art. As indicated by a dotted line, the presence of a logic signal (a logic level "1") at the respective control terminals 414 and 434 actuates the selector switches to be in the positions as indicated in FIG. 6, wherein during the time interval between $t_1$ and $t_2$ (equivalent to the interval $T_{V3}$ of the pulse 128) the first selector switch 410 is actuated to connect its input terminal 411 to its output terminal 415 and to leave disconnected the output terminal 417 from the corresponding input terminal 413. Similarly, the presence of the pulse 128 at the control terminal 434 of the second selector switch 430 actuates the switch so that an input terminal 431 (third level V3) is connected to an output terminal 435, and an output terminal 437 remains disconnected from an input terminal 433, the latter terminal being connected by the common lead 420 to the output terminals 415 and 417 of the first selector switch 410. Thus, as shown at this instant of time during the interval between $t_1$ and $t_2$, only the adjusted third level signal V3 (from level adjustor 360) will be provided at the common output lead 440 of the second selector switch 430 even though the adjusted high level V1 signal (from level adjustor 330) is provided at the same time via the first selector switch 410 to the second input terminal 433 of the second selector switch 430. Once the logic level pulse 128 has terminated (a logic level "0"), the second selector switch 430 will now connect its output terminal 437 to its second input terminal 433, thereby providing the adjusted high level V1 signal to the output lead 440 for the remainder of the duration of the V1 logic level pulse 120 applied to the control terminal 414 of the first selector switch 410.

Accordingly, a signal on lead 440 is reflective of both the pulse 120 and the pulse 128, each at their respectively adjusted signal levels, and temporally related.

As indicated previously, the clock driver amplifier 520 (operative to provide an output signal ranging between about +15 volts and −15 volts) at an output terminal 515 thereof, has a defined output source resistance 530 which is preferably relatively low, for example, in the range of between 1 ohm and 5 ohms. The output terminal 515 of the clock driver amplifier 520 is connected via a lead 540 to an input terminal 621 of a purely resistive isolation network assembly 620 network of a plurality of identical resistive isolation networks 640/1, 640/2, 640/3, through 640/N. The input terminal 621 is connected via common leads 623 to an input of each one of the resistive networks. Each one of the resistive isolation networks has a separate output terminal 627, with each of these terminals 627 connected via a separate lead 70 (such as one conductor of a multi-conductor cable) to an input terminal 64 of each separate one of a plurality of CCD image sensors 10/1, 10/3, through 10/N. As indicated, all but one of the plurality of image sensors is shown to have a short-circuit input failure, as denoted by S/3 and S/N.

In order to continue the reliability testing under dynamic operating conditions of the sole remaining functioning image sensor 10/1, the resistive value of each one of the resistive isolation networks 640 is selected such that the signal level at the input terminal 64 of the CCD image sensor 10/1 remains within a specified level which will ensure its continuing dynamic testing within acceptable imaging performance tolerances. For example, if each one of the resistive isolation networks 640/1 through 640/N has a resistive value of 100 ohms and the output source resistance 530 of the clock driver amplifier 520 has a value of 1 ohm, it can be appreciated that, for a plurality of N =20, a short-circuit input failure of 19 of the 20 CCD image sensors would effectively result in a reduction of the signal level to the input of the one remaining functioning sensor (10/1) to a level of about 84% of the signal level available at the input of each image sensor prior to any short-circuit failure events.

It should also be noted that the solid-state selector switches 410 and 430, as well as the clock driver amplifier 520 with its specified source resistance 530, are all operative at the relatively high frequencies of clock signals required by CCD image sensors under dynamic operating conditions (such as providing image signals). For example, clock frequencies of the horizontal control signals H1 and H2 may be in the range of between 1 and 10 MHz under dynamic testing conditions of a plurality of packaged CCD image sensors. It should be further noted that some type of CCD image sensors may require control signal levels having a "high" signal level of −2 volts and a "low" signal level of −10 volts, whereas another type of CCD image sensors may require control signal levels having a "high" level of +9 volts and a "low" level of −1 volt. The test system in accordance with the present invention can be readily and selectably adjusted with respect to various required signal levels, and can readily provide timing pulses of selectable and synchronized frequencies and temporal relationships having the selectably adjusted control signal levels. The system of FIG. 6 provides these clocked control signals to the input of each one of a plurality of CCD image sensors, where each input can have a significant input capacitance value (prior to the occurrence of a short-circuit input failure).

Figure 7:
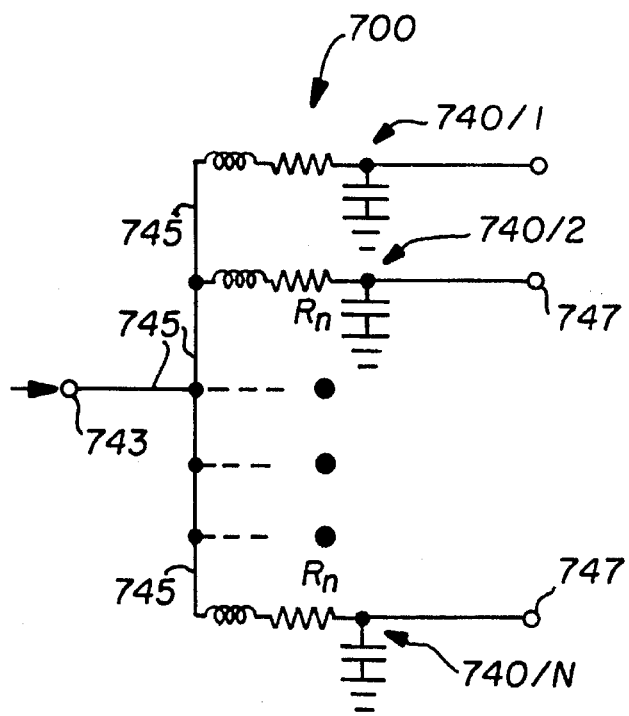
FIG. 7 shows as another embodiment of the invention a pulse-shaping isolation network assembly having a plurality of N pulse-shaping isolation networks.

Referring now to FIG. 7, there is shown another embodiment of an isolation network assembly 700 having an input terminal 743 connected via common leads 745 to an input of each one of a plurality of pulse shaping isolation networks 740/1, 740/2, through 740/N, where each of the networks has a network capacitor $C_n$ connected in parallel to a network resistor $R_n$. Each individual pulse shaping network has a discrete output terminal 747. The pulse shaping isolation network assembly 700 may be advantageously used in place of the purely resistive isolation network assembly 620 of FIG. 6 to provide a degree of pulse shaping of the leading edges of the clocked signal pulses.

A fully implemented test system (not shown) for dynamic testing of a plurality of N CCD image sensors (all of the same class and type) is constructed on two major circuit boards, with a first circuit board including for each one of the required clocked signals (for example, the clocked vertical control signals V1, V2, and V3 and the clocked horizontal control signals H1 and H2 and the reset signal HR) the requisite control signal level adjustors, the inputs of the control signal selector switches coupled to respective ones of the level-adjusted control signals, and a control terminal of each selector switch coupled to a timing pulse logic generator which can selectably provide pulsed logic signals of a desired frequency and temporal relationship with respect to the other clocked control signals, and a single clock driver having a specified output source resistance. Also provided on the first circuit board are connectors and leads required to apply DC bias voltages as required for the operation of the image sensors, and a ground reference.

Mounted on a second circuit board are a plurality of N sockets or receptacles, each one of which is matingly receiving one CCD image sensor (of the same class and type). This second circuit board is configured to provide to each socket and/or receptacle, the appropriate number of leads (for example, the nine input leads shown in FIG. 1). This is achieved by disposing on the second circuit board one isolation network assembly dedicated to each one of the clocked control signals, and having the common input terminal of each network connected to a dedicated terminal on an input terminal strip of that board. Each separate output terminal of the isolation networks is connected to a corresponding terminal on each of the sockets. By this configuration it is evident that the second circuit board requires no more connections to the first circuit board than would be required by a single image sensor package 10 of FIG. 1.

Thus, the disposition on one separate circuit board of all of the control signal generating components of the test system on the one hand, and the disposition on another separate circuit board of all of the isolation network assemblies as well as the CCD image sensors in respective sockets on the other hand, provides for a significant reduction in the level of complexity of interconnections, since the "signal generating board" provides at its circuit board output terminal strip only the required number of control signals and, therefore, the corresponding number of leads, and a matingly connectable circuit board input terminal strip of the "network and image sensor board" receives these control signals via the same number of connections.

The required DC-bias control signals (such as B1 and B2 of FIG. 1) are provided by level adjustors (on the first circuit board) and these control signals as well as the ground reference are "transferred" from the output terminal strip of the first board to the input terminal strip of the second board at respectively dedicated terminals thereof.

Each one of the signal output terminals of the CCD image sensors is connected to a dedicated terminal of a second or output terminal strip on the second circuit board, so that these output signals can be sampled during the dynamic testing of the plurality of CCD image sensors.

One important feature of the aforementioned arrangement is that the "network and image sensor board" can be placed into an environmental chamber for the purpose of testing, at the same time, the reliability of a plurality of CCD image sensors under controlled environmental conditions such as, for example, a selectable temperature, a selectable level of relative humidity, a selectable illumination, or a selectable atmospheric condition.

Reliability testing of the plurality of CCD image sensors may be accomplished by any number of known methods used in reliability determinations. For example, it may be desirable in the testing of a plurality of CCD image sensors to use as a measure of reliability the time required under dynamic test conditions until certain device failure modes become evident. Such failure modes are the aforementioned catastrophic short-circuit input failure of a clocked input with respect to a ground reference, a short-circuit failure associated with any of the DC bias signals (such as B1 and B2 of FIG. 1), as well as failure modes due to evolving electrical discontinuities by, for example, loosening bond wires 58 or deteriorating bond pads 59.

There are numerous ways of continuously or intermittently monitoring the performance of each one of the plurality of N CCD image sensors throughout the duration of a dynamic test. One convenient and readily visually observable method of monitoring the performance of each image sensor under test is to provide a means for sampling the output signal of each image sensor and to display such sampled outputs on a television monitor. Such a sampling means can be, for example, a mechanical switch having N input terminals and a rotating sweeper arm providing an output terminal connected to a monitor, and alternatively the sampling means can be a solid-state multi-input multiplexer having an output thereof connected to a monitor.

A test system and method has been disclosed for dynamic testing of a plurality of packaged charge coupled device image sensors by which a plurality of image sensors of the same type can be tested at the same time under conditions which include selected signal levels and selected clocked signals appropriate to the type of CCD image sensor constituting that plurality of N CCD image sensors, such that even under conditions of catastrophic short-circuit failure at the inputs of N-1 of the plurality of N sensors, the sole remaining functional image sensor can continue to be tested dynamically within a specified lower limit of input signal levels. The test system can readily provide different signal levels for the clocked control signals and different clock pulse frequencies as appropriate to a plurality of N CCD image sensors of a different class or type of sensor, so long as all the image sensors are of one and the same type. Various modifications may become apparent to those skilled in the art regarding the particular configuration of the test system of the invention or of the major components of the test system. For example, an isolation network assembly may include combinations of resistors, capacitors, and inductors for the purpose of pulse shaping of the clocked signals. With minor modifications, clocked signals can be generated having more than three adjustable signal levels. Still further, clock drivers having more than one input terminal and/or more than one output terminal can be advantageously used in conjunction with the present invention. And the number and particular configuration of the control signal selector switches may be readily adapted to suit new or different control signal requirements. Accordingly, it is to be understood that the embodiments described herein are merely illustrative of the scope of the invention and modifications and other arrangements are possible without departing from the spirit and scope of the invention.

PARTS LIST

| | |
|---|---|
| 10 | packaged CCD image sensor (package) |
| 10/1 | first one of a plurality of CCD image sensors |
| 10/2 | second one of a plurality of CCD image sensors |
| 10/3 | third one of a plurality of CCD image sensors |
| 10/N | Nth one of a plurality of CCD image sensors |
| 12 | CCD image sensor |
| 50 | pixels |
| 52 | a first row (horizontal line) of pixels |
| 53 | a last row of pixels |
| 54 | vertical shift registers |
| 56 | arrows (vertical charge transfer direction) |
| 57 | horizontal shift register |
| 58 | connections internal to a CCD image sensor |
| 59 | bond pads |
| 62 | bond wires (input) |
| 63 | bond wire (output) |
| 64 | input terminals (CCD) |
| 65 | output terminal (CCD) |
| 70 | multi-conductor cable |
| 71 | lead (output) |
| 73 | lead (to monitor) |
| 75 | lead (common) |
| 77 | lead (common) |
| 100 | control signal supply |
| 101 | vertical clock logic unit (V1) |
| 102 | control signal supply |
| 104 | output terminal |
| 105 | input terminal |
| 107 | output terminal |
| 110 | vertical clocks logic unit |
| 112 | vertical clock logic unit (V1) |
| 120 | vertical clock pulses (V1; V2) |
| 128 | frame shift pulse (V3; third level) |
| 130 | bias and ground unit |
| 137 | output terminal |
| 139 | multi-conductor cable |
| 150 | driver power supply |
| 151 | lead |
| 155 | lead |
| 160 | horizontal clocks logic unit |
| 164 | horizontal clock logic unit (H2) |
| 170 | horizontal clock pulses (H1; H2) |
| 171 | terminal |
| 172 | clock driver (V1) |
| 176/1 | first one of a plurality of clock drivers |
| 176/2 | second one of a plurality of clock drivers |
| 176/N | Nth one of a plurality of clock drivers |
| 177/1 | input terminal |
| 177/2 | input terminal |
| 177/N | input terminal |
| 179/1 | output terminal |
| 179/2 | output terminal |
| 179/3 | output terminal |
| 191 | multi-conductor cable |
| 192 | multi-conductors |
| 193 | multi-conductors |
| 200 | monitor |
| 300 | control signal level adjustor assembly |
| 310 | control signal level adjustor |
| 312 | potentiometer (low level) |
| 315 | output terminal |
| 320 | lead |

-continued

PARTS LIST

| | |
|---|---|
| 330 | control signal level adjustor |
| 332 | potentiometer (high level) |
| 335 | output terminal |
| 340 | lead |
| 360 | control signal level adjustor |
| 362 | potentiometer (third level) |
| 365 | output terminal |
| 370 | lead |
| 400 | control signal selector assembly |
| 410 | control signal selector switch |
| 411 | input terminal |
| 413 | input terminal |
| 414 | control terminal |
| 415 | output terminal |
| 417 | output terminal |
| 420 | lead (common) |
| 430 | control signal selector switch |
| 431 | input terminal |
| 433 | input terminal |
| 434 | control terminal |
| 435 | output terminal |
| 437 | output terminal |
| 440 | lead (common) |
| 460 | timing pulse logic generator |
| 465 | output terminal |
| 470 | lead |
| 475 | output terminal |
| 480 | lead |
| 500 | clock driver |
| 511 | input terminal |
| 515 | output terminal |
| 520 | clock driver amplifier |
| 530 | output source resistance |
| 540 | lead |
| 600 | isolation network assembly |
| 601 | input terminal |
| 603 | leads (common) |
| 607 | output terminals |
| 610/1 | first one of a plurality of isolation networks |
| 610/2 | second one of a plurality of isolation networks |
| 610/3 | third one of a plurality of isolation networks |
| 610/N | Nth one of a plurality of isolation networks |
| 620 | resistive isolation network assembly |
| 621 | input terminal |
| 623 | leads (common) |
| 627 | output terminals |
| 640/1 | first one of a plurality of resistive isolation networks |
| 640/2 | second one of a plurality of resistive isolation networks |
| 640/3 | third one of a plurality of resistive isolation networks |
| 640/N | Nth one of a plurality of resistive isolation networks |
| 700 | pulse-shaping isolation network assembly |
| 743 | input terminal |
| 745 | leads (common) |
| 747 | output terminals |
| 740/1 | first one of a plurality of pulse-shaping isolation networks |
| 740/2 | second one of a plurality of pulse-shaping isolation networks |
| 740/N | Nth one of a plurality of pulse-shaping isolation networks |
| B1 | bias control signal (DC) |
| B2 | bias control signal (DC) |
| C | input capacitance; effective input capacitance |
| $C_n$ | network capacitor (pulse-shaping isolation network) |
| GRD | ground reference |
| HR | horizontal reset control signal (clocked) |
| H1 | horizontal control signal (clocked) |
| H2 | horizontal control signal (clocked) |
| HBLK | horizontal blank interval |
| $R_n$ | network resistor (pulse-shaping isolation network) |
| S/1 | short-circuit input failure of a first CCD image sensor |
| S/2 | short-circuit input failure of a second CCD image sensor |
| S/N | short-circuit input failure of an Nth CCD image sensor |
| $T_H$ | duration of a horizontal clock pulse (pulses 170; H1, H2) |
| $T_{V1, 2}$ | duration of a vertical clock pulse (pulses 120; V1, V2) |
| $T_{V3}$ | duration of a frame shift clock pulse (pulse 128; V3) |
| $V_1$ | vertical control signal (clocked) |
| $V_2$ | vertical control signal (clocked) |

-continued

PARTS LIST

| | |
|---|---|
| $V_3$ | vertical control signal (clocked; third level) |
| VBLK | vertical blank interval |
| +V | supply voltage |
| −V | supply voltage |

We claim:

1. A test system for dynamic testing at the same time a plurality of packaged same-type charge coupled device (CCD) image sensors with each CCD image sensor of the plurality requiring for an acceptable imaging performance during the testing thereof certain ones of at least two-level clocked control signals at input terminals dedicated therefor and presenting an input capacitance thereto, certain other ones of DC bias control signals at input terminals dedicated therefor, and a ground reference at an input terminal dedicated therefor, each CCD image sensor providing at least one output signal at an output terminal dedicated therefor, the output signal indicative of the imaging performance during the dynamic testing, the test system comprising:

a control signal level adjustor assembly including control signal level adjustors each of which is dedicated to selectably providing at an output terminal thereof a selected level-adjusted control signal for each particular one of the certain required control signals;

a control signal selector assembly including at least one control signal selector switch dedicated to selectably generating at an output terminal thereof a particular one of the certain clocked control signals having one of the at least two levels determined by one of the level-adjusted control signals applied to a first input terminal thereof and having another one of the levels determined by another one of the level-adjusted control signals applied to a second input terminal thereof, and having clocked control signal cycles determined by the selector switch connecting its output terminal to the first input terminal and alternatively to the second input terminal in response to a timing logic signal applied to a control terminal of the selector switch;

a clock driver including a clock driver amplifier which has an input terminal thereof connected to the output terminal of the at least one control signal selector switch and providing at an output terminal thereof the level-adjusted clocked control signal, the clock driver amplifier having a defined output source resistance and frequency response;

an isolation network assembly including a plurality of identical isolation networks having a common input terminal connected to the output terminal of the clock driver, and each one of the plurality of isolation networks having a separate output terminal connected to the corresponding dedicated input terminal of each one of the plurality of CCD image sensors to be dynamically tested; and means for sampling the output signal of each one of the plurality of packaged CCD image sensors during the dynamic testing of the plurality.

2. The test system of claim 1, wherein the plurality of CCD image sensors and the plurality of isolation networks is a number N greater than 1, and the at least two levels of the clocked control signal are maintained within a preselected range of signal levels at the dedicated input terminal of one CCD image sensor being tested upon short-circuit failure at the input terminals of N-1 of the CCD image sensors.

3. The test system of claim 1, wherein the isolation network assembly includes a plurality of purely resistive isolation networks.

4. The test system of claim 1, wherein the isolation network assembly includes a plurality of pulse-shaping networks.

5. The test system of claim 1, wherein the control signal selector assembly includes a first and a second control signal selector switch with each of the selector switches having a first and a second input terminal, at least one output terminal, and a control terminal, the first selector switch having its first and second input terminals each connected to a respective output terminal of a control signal level adjustor and its output terminal connected to a first input terminal of the second control signal selector switch, the second selector switch having its second input terminal connected to an output terminal of another dedicated control signal level adjustor providing a third control signal level and the output terminal of the second selector switch connected to the input terminal of the clock driver, the second control signal selector switch selectably generating at its output terminal a clocked third-level control signal in response to a timing logic signal applied to its control terminal and alternatively providing in the absence of the timing logic signal the two-level clocked control signal generated at the output terminal of the first control signal selector switch.

6. A test system for dynamic testing at the same time a plurality of packaged same-type charged coupled device (CCD) image sensors with each CCD image sensor of the plurality requiring for an acceptable imaging performance during the testing thereof a first number of certain clocked control signals applied to a corresponding number of input terminals dedicated therefor, a second number of certain DC bias control signals applied to a corresponding number of input terminals dedicated therefor, and a ground reference at an input terminal dedicated therefor, each packaged CCD image sensor providing an output signal at an output terminal dedicated therefor, the test system comprising:

a first circuit board having an input terminal strip and an output terminal strip, a number of dedicated terminals of the input terminal strip connected to power supplies and a ground reference external thereof, the number of dedicated terminals of the output terminal strip not exceeding the sum of the first number of clocked signals, the second number of DC bias signals, and the ground reference;

a second circuit board having an input terminal strip and an output terminal strip with terminals of the input terminal strip matingly engaging the terminals of the output terminal strip of the first circuit board, each of the terminals of the input terminal strip of the second circuit board dedicated to the certain DC bias control signals and to the ground reference being connected to a corresponding dedicated terminal of each one of a plurality of receptacles within each one of which a packaged CCD image sensor can be received for dynamic testing;

an arrangement on the first circuit board for generating each one of the first number of certain clocked control signals including a control signal level adjustor assembly, a control signal selector assembly, and a clock driver having an output terminal thereof connected to a terminal of the output terminal strip dedicated therefor, whereby a certain one of the clocked control signals is provided at that terminal;

an arrangement on the first circuit board for each one of the second number of certain DC bias control signals including a control signal level adjustor assembly having an output terminal thereof connected to a terminal of the output terminal strip dedicated therefor, whereby a certain one of the DC bias control signals is provided at that terminal;

a connection on the first circuit board between respective ones of terminals on the input terminal strip and the output terminal strip to provide the ground reference at a terminal of the output terminal strip dedicated therefor;

an arrangement on the second circuit board for each one of the first number of certain clocked control signals including an isolation network assembly having a common network input terminal thereof connected to a terminal dedicated therefor on its input terminal strip and having each separate one of a plurality of network output terminals connected to a corresponding terminal dedicated therefore on each one of the plurality of receptacles; and an arrangement on the second circuit board whereby the dedicated output signal terminal of each receptacle is connected to a dedicated terminal of the output terminal strip so that the output signals of each CCD image sensor can be provided thereon for sampling thereof during the dynamic testing of the plurality of CCD image sensors.

7. A method of dynamically testing at the same time a plurality of packaged charge coupled device (CCD) image sensors with each CCD image sensor of the plurality requiring for an acceptable imaging performance during the testing thereof certain ones of at least two-level clocked control signals at input terminals dedicated therefor and presenting an input capacitance thereto, certain other ones of DC bias control signals at input terminals dedicated therefor, and a ground reference at an input terminal dedicated therefor, each CCD image sensor providing at least one output signal at an output terminal dedicated therefor, the output signal indicative of the imaging performance during the dynamic testing, the method comprising the steps of:

providing a level-adjusted control signal of a selectable signal level at an output terminal of a control signal level adjustor for each particular one of the certain required control signals;

generating at an output terminal of a control signal selector assembly from selected ones of the level-adjusted control signals each one of the certain ones of the required clocked control signals having at least two signal levels;

amplifying each one of the generated clocked control signals in a clock driver amplifier dedicated therefor and having a defined output source resistance at an output terminal thereof;

applying each one of the amplified clocked control signals to a common input terminal of an isolation network assembly having the same plurality of separate output terminals as the plurality of CCD image sensors to be tested;

connecting each one of the separate network output terminals to a corresponding input terminal of each one of the CCD image sensors;

providing the certain ones of the required DC bias control signals and the ground reference to the respectively dedicated CCD image sensor input terminals;

testing the plurality of CCD image sensors at the same time; and sampling the output signal generated by each one of the plurality of CCD image sensors as an indication of imaging performance during the dynamic testing.

* * * * *